United States Patent

Slobodnik, Jr.

[15] 3,680,009

[45] July 25, 1972

[54] ACOUSTIC SURFACE WAVE DELAY LINE

[72] Inventor: Andrew J. Slobodnik, Jr., Lowell, Mass.

[73] Assignee: The United States of America as represented by the Secretary of the Air Force

[22] Filed: March 18, 1971

[21] Appl. No.: 125,572

[52] U.S. Cl. ....................333/30, 310/9.5

[51] Int. Cl. ....................H03h 7/30

[58] Field of Search ....................333/30; 310/9.5

[56] References Cited

UNITED STATES PATENTS

| | | | |
|---|---|---|---|
| 3,591,813 | 7/1971 | Coquin | 310/9.5 |
| 3,568,079 | 3/1971 | Yoder | 333/30 |
| 3,568,080 | 3/1971 | Troutman | 333/30 |
| 2,490,216 | 12/1949 | Jaffe | 310/9.5 |
| 3,461,408 | 8/1969 | Onoe et al. | 310/9.5 X |

OTHER PUBLICATIONS

" Acoustic Attenuation of a Single-Domain Lithium Niobate Crystal at Microwave Frequencies" by Mayo et al., Vol. 9, No. 4, 8/15/66—Applied Physics Letters, pps. 135 & 136

*Primary Examiner*—Herman Karl Saalbach
*Assistant Examiner*—Saxfield Chatmon, Jr.
*Attorney*—Harry A. Herbert, Jr. and Willard R. Matthews, Jr.

[57] ABSTRACT

An acoustic surface wave delay line having a lithium niobate substrate member the surface wave propagation plane of which is parallel to the lithium niobate crystalline X axis and intersects the crystalline Z and −Y axes. Optimum results are obtained when the intersecting angle of the propagation plane and the Z axis is in the vicinity of 48.5°.

3 Claims, 3 Drawing Figures

PATENTED JUL 25 1972

3,680,009

INVENTOR
ANDREW J. SLOBODNIK Jr.
BY Harry A. Herbert Jr.
and
Willard R. Matthews
ATTORNEYS

ACOUSTIC SURFACE WAVE DELAY LINE

BACKGROUND OF THE INVENTION

This invention relates to acoustic surface wave devices and particularly to microwave frequency acoustic delay lines requiring long time delays.

Volume or bulk wave acoustic devices such as acoustic delay lines, phase shifters and directional couplers have been used in microwave systems for some time. Recently in an attempt to reduce power requirements considerable effort has been expended to perfect various acoustic surface wave devices.

Microwave frequency surface wave devices have several advantages over their volume wave counterparts. Surface waves require only one optically polished surface whereas volume waves require two surfaces which must be parallel to optical tolerances. The fabrication techniques for surface wave transducers are the same as those used for integrated circuits so that a surface wave delay line could, for example, be fabricated on a substrate member together with a transistor amplifier. The current state of the art of microwave acoustic surface wave devices is reviewed in detail in the publication, The Generation and Propagation of Acoustic Surface Waves at Microwave Frequencies, by Paul H. Carr, IEEE Transactions on Microwave Theory and Techniques, Vol. MTT, No. 11, Nov. 1969.

The acoustic surface wave delay lines represented by the current state of the art, while being in many respects superior to electromagnetic devices, are still subject to various limitations. For instance, in order to achieve 50 ohm operation of an acoustic device in a microwave system, conventional acoustic devices require matching metworks. This requirement of course adds weight, cost and circuit complexity to the system. Other deficiencies of currently available acoustic delay lines include limited bandwidth, low electromagnetic to acoustic energy conversion efficiency, and high frequency limitations for a given transducer linewidth. Furthermore, fabrication of these devices is difficult and costly due to the initial x-ray alignment procedures required to minimize beam steering. There is currently a need therefore for inexpensive, efficient, broadband microwave frequency acoustic delay lines that are capable of long time delays and that do not require external inductive matching. The present invention is directed toward achieving this and other ends.

SUMMARY OF THE INVENTION

The present invention is an acoustic surface wave line fabricated from a single crystal lithium niobate substrate member. The acoustic surface wave propagation surface is cut in a plane parallel to the lithium niobate crystalline X axis and in intersecting relationship with the crystalline Z and −Y axes. Optimum results are achieved when the angle of intersection of the propagation surface and the Z axis is 48.5°. Input and output transducers are put on the propagation surface by standard photolithographic techniques. The geometry, dimensions and relative positions of the transducer are determined by the operating frequency, delay time requirement, and other parameters of the particular device specified.

It is a principal object of the invention to provide a new and improved acoustic surface wave delay line.

It is another object of the invention to provide an acoustic surface wave delay line having 50 ohm input impedance under unmatched and untuned conditions.

It is another object of the invention to provide an acoustic surface wave delay line having minimal beam steering loss.

It is another object of the invention to provide an acoustic surface wave delay line having a wide bandwidth and higher electromagnetic to acoustic energy conversion efficiencies than currently available acoustic wave delay lines.

It is another object of the invention to provide an acoustic surface wave delay line capable of higher frequency operation for a given transducer line width than currently available devices.

It is another object of the invention to provide an acoustic surface wave delay line that does not require external inductive matching.

It is another object of the invention to provide an acoustic surface wave delay line whose fabrication does not require critical X-ray alignment.

These, together with other objects, features and advantages of the invention, will become more readily apparent from the following detailed description when taken in conjunction with the illustrative embodiment of the accompanying drawings.

DETAILED DESCRIPTION OF THE PREFERRED EMBODIMENT

Figure 1:
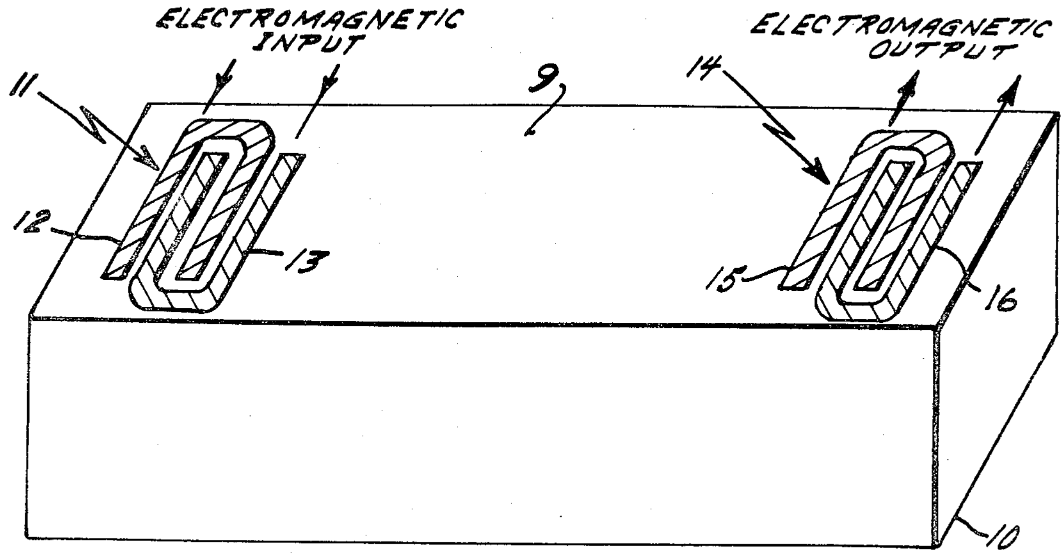
FIG. 1 is an orthogonal view of a microwave frequency acoustic surface wave delay line as comprehended by the present invention.
Figure 2:
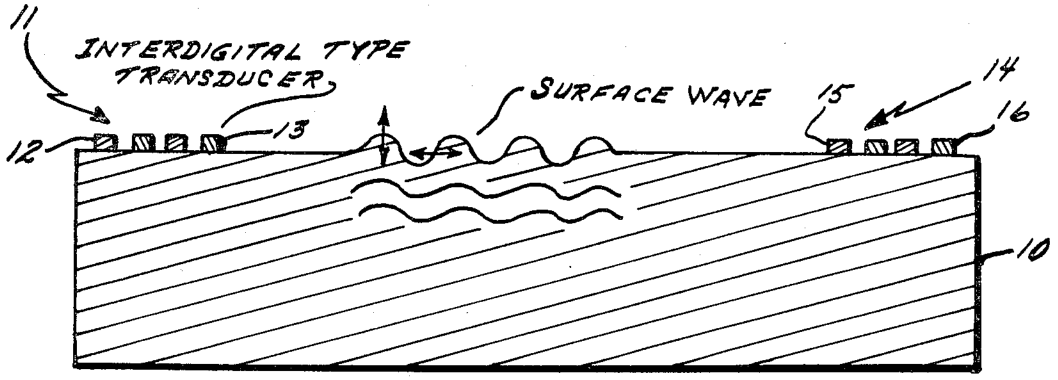
FIG. 2 is a side view of the delay line of FIG. 1 schematically illustrating acoustic surface waves propagating there along; and, FIG. 3 is an end view of the delay line of FIG. 1 schematically illustrating the relationship of the propagation surface to the substrate member's crystalline X, Y and Z axes as comprehended by a preferred embodiment of the invention.

Referring now to FIGS. 1 and 2 there is illustrated thereby an acoustic surface wave delay line comprising substrate member 10, input transducer 11 and output transducer 14. Substrate member 10 is fabricated of single crystal lithium niobate ($LiNbO_3$). Input transducer 11 consists of interdigital fingers 12 and 13 which may be affixed to the propagating surface 9 by standard photolithographic techniques. Output transducer 14 consisting of interdigital fingers 15 and 16 is similarly affixed to propagation surface 9. Operation of the device is illustrated by FIG. 2. The electromagnetic wave input produces an electric field between the half wave spaced line of the interdigital type transducer on the piezoelectric (lithium niobate) substrate. The piezoelectric effect produces a stress which propagates along the surface in both directions, the two acoustic powers being equal by symmetry. The surface wave propagating toward the output transducer is detected by means of the piezoelectric effect. The wave propagating in the opposite direction can be terminated by an acoustic absorber such as wax or tape (not shown).

Figure 3:
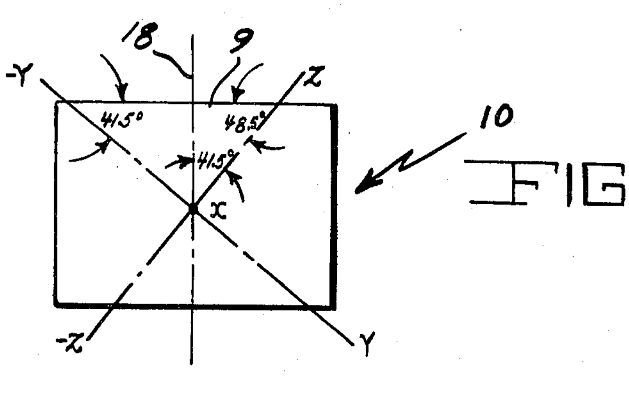

The essence of the present invention resides in the discovery of a new high frequency, high coupling low beam steering cut for acoustic surface wave propagation on lithium niobate. Such a cut is illustrated by FIG. 3.

In accordance with the principle of the invention, substrate member 10 must be fabricated of single crystal lithium niobate. The acoustic surface wave propagating surface 9 must be oriented with its length along and parallel to the crystalline X- axis. It must also intersect the crystalline −Y and Z axes as shown. It has been found that optimum performance can be achieved when the normal 18 of the propagating surface 9 is approximately 41.5° from the Z axis. It is essential that correct axis signs be observed. The interdigital transducers are deposited on both ends of the polished surface 9 using photolithographic techniques. The distance between the transducers determines the delay time according to the formula:

delay time (seconds)=distance (meters)/3999.

where 3999. is the surface wave velocity.

By way of example, a particular delay line has been developed having a delay time of five microseconds that is capable of 50 ohm operation with 10 percent bandwidth under untuned conditions at 1130 MHz. This device utilized 20 fingers or 10 pairs for the interdigital transducers which are 200 microns long. Line width and spacing are both 0.85 microns. These parameters, of course, vary for operation at different frequencies. Actual operation of the device is accomplished by placing an alternating electromagnetic potential (within the design band of the transducer) across the interdigital fingers. Input and output are accomplished in a reciprocal manner.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. A lithium niobate acoustic surface wave delay line having its propagation surface parallel to the lithium niobate crystalline X axis and in intersecting relationship with the lithium niobate crystalline Z and −Y axes, the intersecting angle between said propagation surface and said crystalline Z axis being not less that 46.5° and not greater than 50.5°.

2. A lithium niobate acoustic surface wave delay line as defined in claim 1 wherein the intersecting angle between said propagation surface and said crystalline Z axis is substantially 48.5°.

3. An acoustic surface wave delay line comprising a single crystal lithium niobate substrate member having a propagation surface adapted to permit the propagation of acoustic surface waves there along, said propagation surface being parallel with the substrate crystalline X axis and intersecting the substrate crystalline Z and −Y axes at 48.5° and 41.5° respectively.

an electromagnetic wave to acoustic wave input transducer disposed on said propagation surface, and an acoustic surface wave to electromagnetic wave output transducer disposed on said propagation surface.

* * * * *